United States Patent [19]

Taguchi

[11] Patent Number: 4,803,535
[45] Date of Patent: Feb. 7, 1989

[54] DYNAMIC RANDOM ACCESS MEMORY TRENCH CAPACITOR

[75] Inventor: Masao Taguchi, Sagamihara, Japan

[73] Assignee: Fujitus Limited, Kanagawa, Japan

[21] Appl. No.: 20,983

[22] Filed: Mar. 2, 1987

[30] Foreign Application Priority Data

Mar. 3, 1986 [JP] Japan .................. 61-045823
Mar. 3, 1986 [JP] Japan .................. 61-045824
Mar. 14, 1986 [JP] Japan .................. 61-057309

[51] Int. Cl.⁴ .............. H01L 29/78; H01L 49/02; H01L 27/02
[52] U.S. Cl. .................. 357/23.6; 357/4; 357/6; 357/41; 357/51; 357/55
[58] Field of Search .............. 357/23.6, 56, 41, 51, 357/55, 4, 6

[56] References Cited

U.S. PATENT DOCUMENTS 4,327,476 4/1976 Iwai et al. .
4,397,075 10/1975 Fatula, Jr. et al. .
4,688,063 8/1987 Lu et al. .................. 357/55

FOREIGN PATENT DOCUMENTS 0187237 7/1986 European Pat. Off. .......... 357/23.6
60-152059 8/1985 Japan .................. 357/23.6
59-191374 10/1985 Japan .................. 357/23.6
60-239053 11/1985 Japan .................. 357/23.6
60-239052 11/1985 Japan .................. 357/41
61-15362 1/1986 Japan .

Primary Examiner—J. Carroll
Assistant Examiner—Ngân V. Ngô
Attorney, Agent, or Firm—Armstrong, Nikaido, Marmelstein & Kubovcik

[57] ABSTRACT

A dynamic random access memory having a trench capacitor includes: a semiconductor substrate; a trench formed in a semiconductor substrate; an insulating layer formed on an inner surface of the trench and having a bottom opening; a first conductive layer formed at the bottom opening position and on the insulating layer and the first conductive layer is ohmically connected to the semiconductor substrate at the bottom opening. The device includes further a dielectric layer formed on the first conductive layer; a second conductive layer formed on the dielectric layer so as to fill the trench, the first conductive layer, the dielectric layer, and the second conductive layer constituting a charge storage capacitor; and a MIS transistor formed in the semiconductor substrate, wherein the second conductive layer is ohmically connected to a source or drain region of the MIS transistor.

8 Claims, 15 Drawing Sheets

DYNAMIC RANDOM ACCESS MEMORY TRENCH CAPACITOR

BACKGROUND OF THE INVENTION

1. Field of the Invention

The present invention relates to an information storage device and, more particularly, to a dynamic random access memory (DRAM) having a trench capacitor.

2. Description of the Related Art

In a conventional DRAM cell having a trench capacitor, a charge storage capacitor is connected to a MIS transistor between a source or drain region and an inversion layer, and the inversion layer on the substrate side serves as a charge storage electrode for storing information charges. A charge storage capacitor of an adjoining cell is formed near each DRAM cell through an isolation layer. As is well known, in this case, a depletion layer may extend through the substrate to cause a punch-through between cells.

A conventional trench capacitor cell of this type has an advantage of a high integration, compared with a memory cell of a planar type, but has the following problems.

The first problem is that of a punch-through between cells in the capacitors. In order to reduce a write voltage loss caused by a decrease in a write voltage due to the presence of a threshold voltage, an impurity concentration of a substrate must be lowered. However, when the impurity concentration is excessively low, a depletion layer can extend further to cause a punch-through cells between the trench capacitors of adjacent cells. These capacitors are then electrically coupled to lose information stored in the cells, which degrades the reliability of the memory system.

In a so-called Hi-C capacitor structure wherein a region having a conductivity type opposite to that of the substrate is formed on the wall surface in a trench, the write voltage loss can be reduced. However, the distance between the adjacent trench capacitors is reduced by a diffusion depth of the region having the opposite conductivity type, thus increasing the possibility of the punch-through between cells.

In this case, an ion implantation or diffusion process must be used for doping an impurity into a trench side wall thus increasing difficulties in memory fabrication.

The second problem is that of soft errors. A large depletion layer extends from a storage electrode (i.e., an inversion layer) in a substrate, and minority carriers generated in the depletion layor or the substrate can be easily captured in the depletion layer and injected into the storage electrode, thus causing a soft error when α-rays are incident on the memory cell.

The third problem is that of the write voltage loss. The charge storage capacitor uses a capacitor formed between a cell plate and an inversion layer of a MOS structure formed in the trench. Accordingly, the maximum write voltage obtained corresponds to a difference between a power supply voltage and a threshold voltage for forming the inversion layer for a voltage applied to the cell plate. More specifically, the maximum voltage available for writing a "HIGH" level is lower than the power supply voltage by about 1 V.

SUMMARY OF THE INVENTION

It is an object of the present invention to provide a dynamic random access memory having an improved trench capacitor.

According to an aspect of the present invention, there is provided a dynamic random access memory having a trench capacitor: a semiconductor substrate; a trench formed in the semiconductor substrate; an insulating layer formed on an inner surface of the trench and having a bottom opening; a first conductive layer formed at the bottom opening position and on the insulating layer, the first conductive layer being ohmically connected to the semiconductor substrate at the bottom opening; a dielectric layer formed on the first conductive layer; a second conductive layer formed on the dielectric layer so as to fill the trench, the first conductive layer, the dielectric layer, and the second conductive layer constituting a storage capacitor; and a MIS transistor formed in the semiconductor substrate, wherein the second conductive layer is ohmically connected to a source or drain region of the MIS transistor.

According to another aspect of the present invention, there is provided a dynamic random access memory having a trench capacitor, including: a semiconductor substrate of one conductivity type; a buried layer of the other conductivity type formed in the semiconductor substrate; a semiconductor layer formed on the semiconductor substrate having the buried layer; a trench extending through the semiconductor layer and reaching the buried layer of the other conductivity type; an insulating layer formed on an inner side surface of the trench; a first conductive layer which is formed on the insulating layer formed on the trench and having a lower portion ohmically connected to the buried layer; a dielectric layer formed on the first conductive layer on the inner surface of the trench; a second conductive layer filled in the trench and formed on the dielectric layer; the first conductive layer, the dielectric layer, and the second conductive layer constituting a storage capacitor; and a MIS transistor for switching a charging or discharging state of the storage capacitor, wherein the second conductive layer is ohmically connected to one of source and drain regions of the MS transistor, and the first conductive layer is supplied, through the buried layer of the other conductivity type, with a bias voltage different from that supplied to the semiconductor substrate.

According. to still another aspect of the present invention, there is provided a dynamic random access memory having a trench capacitor, including: a semiconductor substrate of one conductivity type; a trench formed in the semiconductor substrate; an insulating layer formed on an entire inner side surface of the trench, the insulating layer having a thickness which allows a passage of carriers therethrough by a tunnel phenomenon; a first conductive layer formed on the insulating layer and maintained at a same potential as that of the semiconductor substrate through the insulating layer; a dielectric layer formed on the first conductive layer; a second conductive layer of the other conductivity type filled in the trench and formed on the dielectric layer, the first conductive layer, the dielectric layer, and the second conductive layer constituting a storage capacitor; and a MIS transistor formed in the semiconductor substrate, wherein the second conductive layer of the storage capacitor is ohmically connected to a source or drain region of the MIS transistor.

BRIEF DESCRIPTION OF THE DRAWINGS

FIGS. 4A to 9A are plan view showing steps in manufacturing the trench capacitor cell shown in FIGS. 2 and 3;

FIGS. 4B to 9B are sectional views showing steps in manufacturing the trench capacitor cell shown in FIGS. 2 and 3;

FIGS. 12A to 17A are plan views showing the steps in manufacturing the trench capacitor cell shown in FIGS. 10 and 11;

FIGS. 12B to 17B are sectional views showing the steps in manufacturing the trench capacitor cell shown in FIGS. 10 and 11;

FIGS. 29A to 34A are plan views showing the steps in manufacturing the trench capacitor cell shown in FIGS. 27 and 28; and FIGS. 29B to 34B are sectional views showing the steps in manufacturing the trench capacitor cell shown in FIGS. 27 and 28.

DESCRIPTION OF THE PREFERRED EMBODIMENT

A conventional trench capacitor cell will be described with reference to FIG. 1, to distinguish the present invention from the prior art and to give a better understanding of the present invention.

Figure 1:
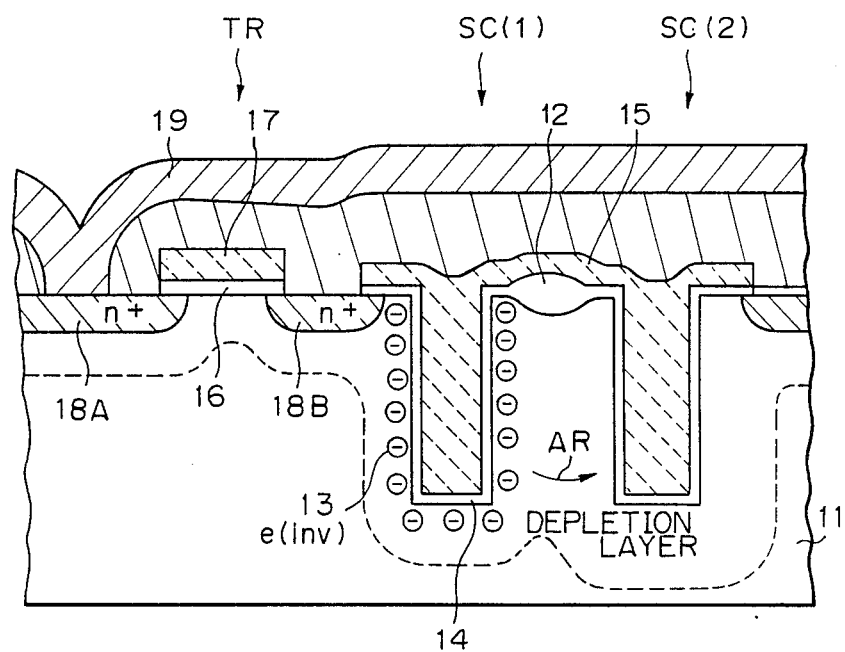
FIG. 1 is a side sectional view of a conventional capacitor cell.

FIG. 1 is a sectional view showing a conventional trench capacitor cell.

Referring to FIG. 1, reference numeral 11 denotes a p type silicon (p type Si) substrate as a semiconductor substrate; 12, a silicon dioxide ($SiO_2$) layer serving as a field insulating layer for defining the cell area; 13, electrons in an inversion layer serving as a charge storage electrode; 14, a dielectric layer; and 15, a cell plate (counter electrode) of polycrystalline silicon (poly-Si) layer. The inversion layer 13, the dielectric layer 14, and the cell plate 15 constitute a charge storage capacitor.

Reference numeral 16 denotes a gate dielectric layer; 17, a poly-Si word line; and 18A and 18B, high impurity regions serving as $n^+$ type source or drain regions. The source or drain regions 18A and 18B and the word line 17 serving as the gate constitute a MIS transistor.

A bit line 19 made of, e.g., aluminum (Al), is formed to be in contact with the source or drain region 18A on the substrate and extends in a direction perpendicular to the word line 17.

In this case, the charge storage capacitor is connected to the MIS transistor between the source or drain region 18B and the inversion layer 13. Therefore, the inversion layer 13 on the substrate side serves as a charge storage electrode for storing information charges.

Each DRAM cell is formed away from a charge storage capacitor of an adjacent cell through the field insulating film 12. The broken line represents the boundary of a depletion layer extending within the substrate. FIG. 1 shows a state wherein a punch-through between cells in the adjacent capacitor has occurred.

A conventional trench capacitor cell of this type has an advantage of a high integration, compared with a cell of a planar type, but has the following disadvantages: (1) a punch-through between cells in the adjacent capacitors (2) soft errors and (3) a write voltage loss can easily occur.

The present invention has been made to solve the above problems and will be described in detail with reference to preferred embodiments below.

Figure 2:
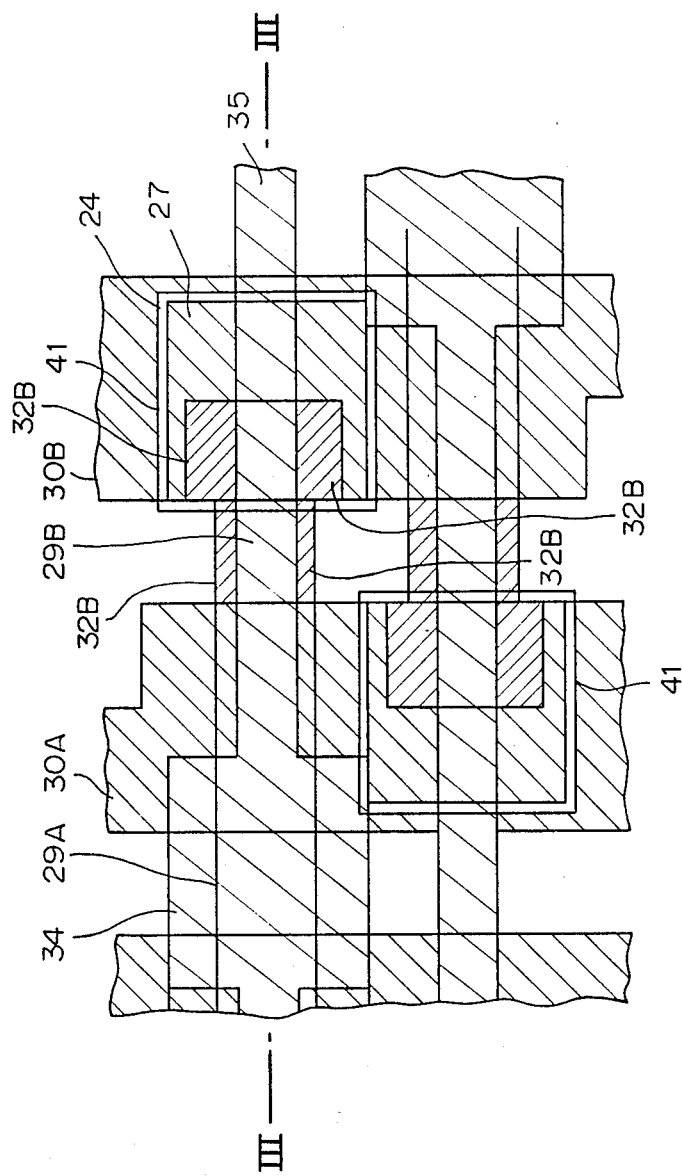
FIG. 2 is a plan view of a trench capacitor cell according to an embodiment of the present invention.
Figure 3:
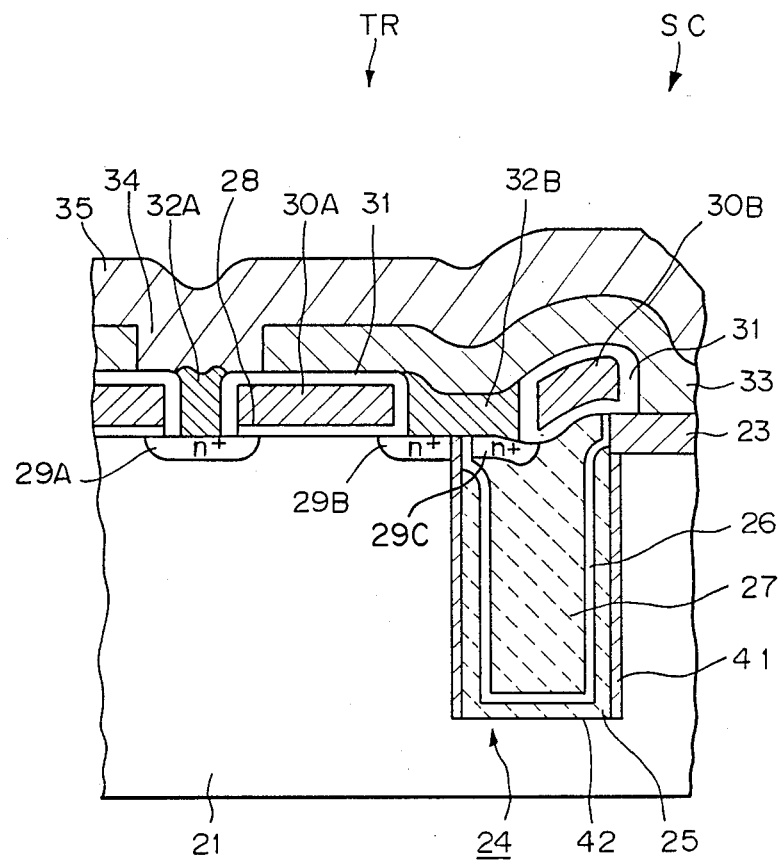
FIG. 3 is a cross-sectional view of the device of FIG. 2 taken along the line III—III.
Figure 8A:
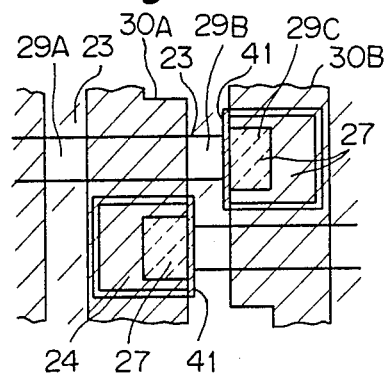
Figure 8B:
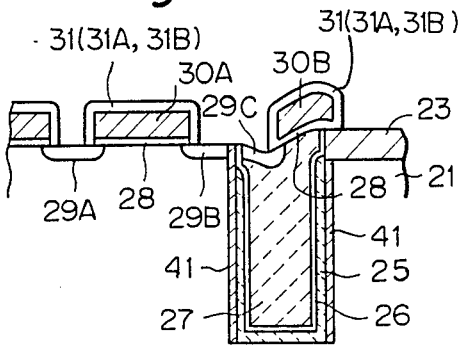
Figure 9A:
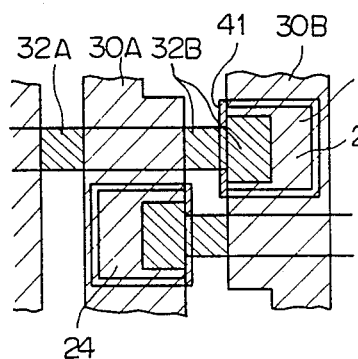
Figure 9B:
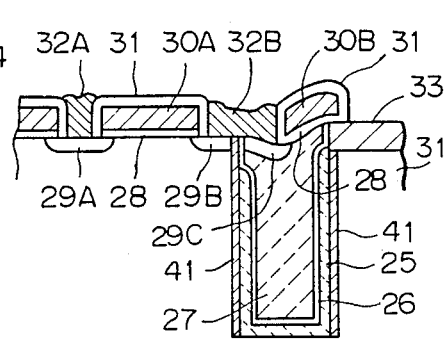
Figure 10:
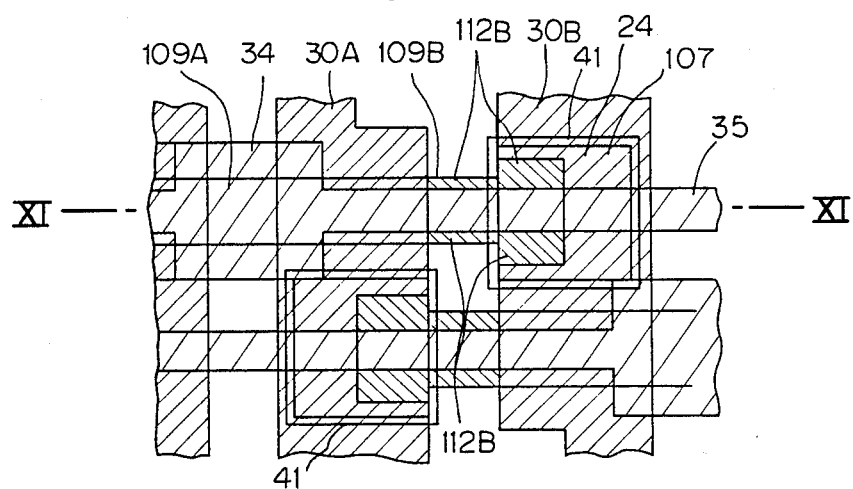
FIG. 10 is a plan view illustrating a trench capacitor cell according to another embodiment of the present invention.
Figure 11:
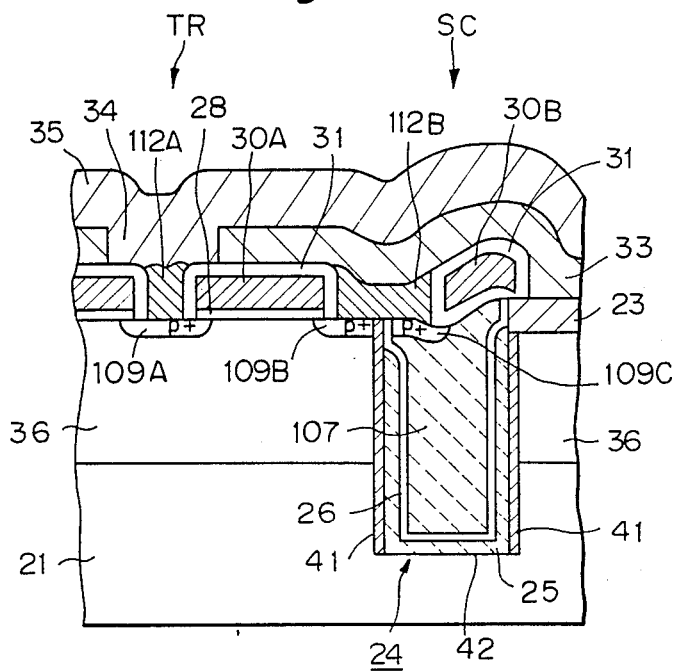
FIG. 11 is a cross-sectional view of the device of FIG. 10 taken along line XI—XI.
Figure 12A:
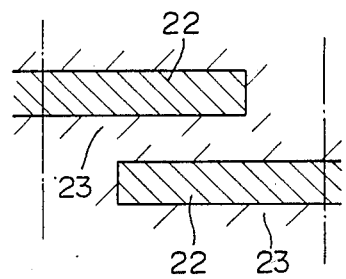
Figure 12B:
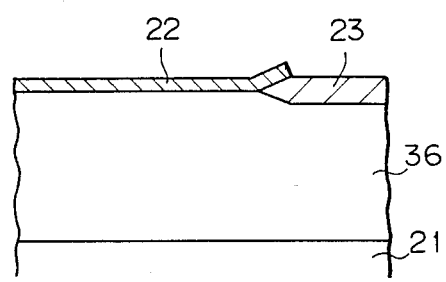

FIG. 2 is a plan view illustrating a trench capacitor cell according to a first embodiment of the present invention, FIG. 3 is a side sectional view thereof, FIGS. 4A to 9A are plan views showing the steps in manufacturing the trench capacitor cell, and FIGS. 4B to 9B are sectional views thereof FIGS. 10 and 11 are respectively a plan view and a side sectional view illustrating a trench capacitor cell according to another embodiment of the present invention, FIGS. 12A to 17A are plan views showing the steps in manufacturing the trench capacitor cell in FIGS. 10 and 11, and FIGS. 12B to 17B are sectional views thereof Referring to FIGS. 2 and 3, reference numeral 21 denotes a p type Si substrate as a semiconductor substrate; 23, an $SiO_2$ layer serving as a field insulating layer for defining a cell area; 24, a trench formed so as to include a field region; and 41, a $SiO_2$ insulating layer having a side wall thickness of 100 to 500 Å and defining the capacitor area. Reference numeral 25 denotes a cell plate (a counter electrode) of $p^+$ type poly-Si formed in the entire area of the trench having the $SiO_2$ insulating layer 24, except for the area near the opening of the trench. The cell plate 25 is in contact with the substrate at the bottom of the trench. The cell plate serves as a first conductive layer. Reference numeral 26 denotes a dielectric layer made of silicon nitride ($Si_3N_4$); and 27, a charge storage electrode of an $n^+$ type poly-Si serving as a second conductive layer. The cell plate 25, the dielectric layer 26, and the charge storage electrode 27, all of which are defined by the $SiO_2$ insulating layer 41, constitute a charge storage capacitor.

Reference numeral 28 denotes an $SiO_2$ layer serving as a gate dielectric layer. Reference numerals 29A and 29B, $n^+$ type source or drain (S/D) regions; 29C, an $n^+$ type region formed simultaneously with the source or drain regions 29A and 29B; 30A, a word line (i.e., a gate electrode) of a self cell which is made of titanium silicide ($TiSi_2$); and 30B, a word line of a cell adjacent to the self cell. The p type Si substrate 21, the gate dielectric layer 28, the n+ type S/D regions 29A and 29B, and the word line 30A constitute a transistor (i.e., a cell transistor) of the self memory cell Reference numeral 31 denotes an SiO₂ insulating layer; 32A, a third conductive layer made of an n+ type poly-Si layer; and 32B, an n+ type poly-Si layer as a third conductive layer electrically connecting a transistor S/D region, e.g., 29B, to the charge storage electrode 27 of the charge storage capacitor. The third conductive layer 32B connects the charge storage capacitor to the cell transistor to constitute a DRAM cell.

Reference numeral 33 denotes an insulating interlayer; 34, a wiring contact hole; and 35, a bit line made of aluminum (Al) which is in contact, with the S/D region 29A through the third conductive layer 32A and which is formed on the insulating interlayer and extends in a direction perpendicular to the word line.

In the trench capacitor cell according to the present invention, the source or drain region 29B of the transistor is electrically connected to the charge storage electrode 27 through the third conductive layer 32 (32B).

The second conductive layer 27 in the trench 24 serves as a charge storage electrode for storing information charges. The first conductive layer 25 on the substrate side serves as a cell plate (i.e., a counter electrode). The functions of these conductive layers are reversed to those in the conventional arrangement.

The above structure prevents the spread of the depletion layer in the substrate, and thus coupling (interference) between the adjacent capacitors can be eliminated.

The third conductive layer, i.e., the n+ type Si layer 32 (32B) for connecting the S/D region 29B of the transistor to the charge storage electrode 27 of the charge storage capacitor can be formed by self alignment with the word line by growing the conductive layer on an Si surface exposed between the word lines 30A and 30B without using a mask process Therefore, micropatterning and a high packing density of the cells can be achieved In the structure according to the present invention, since the insulating layer 31 is formed on the side wall surface of the trench to define the capacitor region, a decrease in impurity concentration in the first conductive layer can be desirably prevented. Such a decrease occurs in the subsequent oxidation process or annealing process after the formation of the S/D regions 29A and 29B wherein impurity ions are diffused, from the p+ type poly-Si layer (the first conductive layer) 25 having a high concentration of about $10^{19}$ cm$^{-3}$, i.e., the cell plate (the counter electrode) having a high impurity concentration and formed on the inner surface of the trench, to the p type Si substrate around the trench 24. Therefore, a decrease in charge storage capacitance of the capacitor, which is caused by formation of a depletion layer at the interface between the p+ type poly-Si layer (the first conductive layer) 25 and the dielectric layer 26, is prevented.

In the above structure, the first conductive layer (the cell plate) 25 is ohmically connected to the substrate 21 in the opening of the capacitor defining SiO₂ insulating layer 31 formed in the bottom of the trench and is kept at the same potential as that of the substrate 21.

A method of manufacturing the trench capacitor cell according to this embodiment will be described with reference to the plan views of FIGS. 4A to 9A and the sectional views of FIGS. 4B to 9B as well as FIGS. 2 and 3.

Figure 4A:
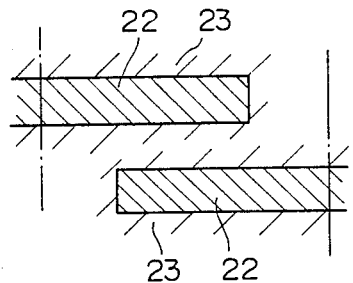
Figure 4B:
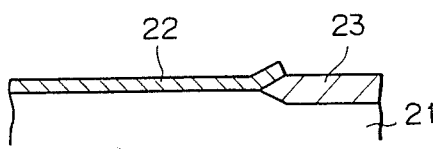

As shown in FIGS. 4A and 4B, for example, an Si₃N₄ layer (or a composite layer of Si₃N₄ and SiO₂) 22 is formed as an antioxide film for selective oxidation on an element formation region on the surface of the p type Si substrate 21. The Si substrate 21 is oxidized using the Si₃N₄ layer 22 as a mask to form a 4,000 Å thick SiO₂ layer 23 as a field insulating layer.

Figure 5A:
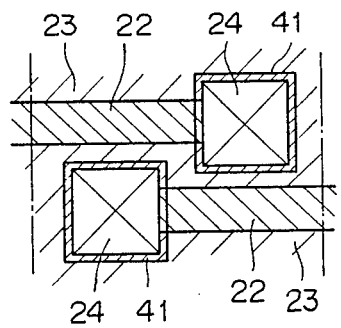
Figure 5B:
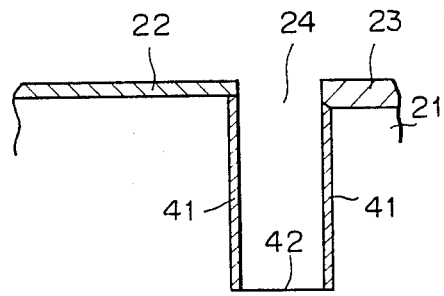

As shown in FIGS. 5A and 5B, using the conventional photolithographic techniques and reactive ion etching (RIE), a trench 24 having a depth of 3 to 4 μm is formed in the antioxide region including part of the field insulating layer 23.

Thermal oxidation is then performed to form a capacitor area defining an SiO₂ insulating layer 41 having a thickness of 300 Å on the inner surface of the trench 24. The thickness of the layer 41 is not limited. However, if the thickness is excessive, the effective size of the trench is reduced. Therefore, the thickness of the layer 41 is preferably less than 1,000 Å.

The SiO₂ insulating layer 41 at the bottom of the trench 24 is selectively removed by an anisotropic etching means such as reactive ion etching (RIE) which is effective in the vertical direction of the substrate surface. Therefore, an opening 42 is formed in such a manner that the surface of the p type Si substrate 21 is exposed.

Figure 6A:
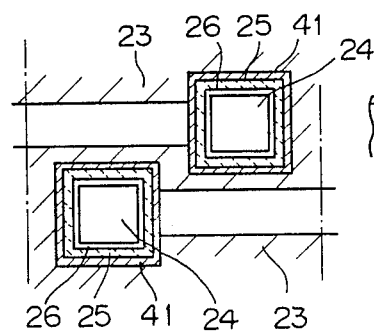
Figure 6B:
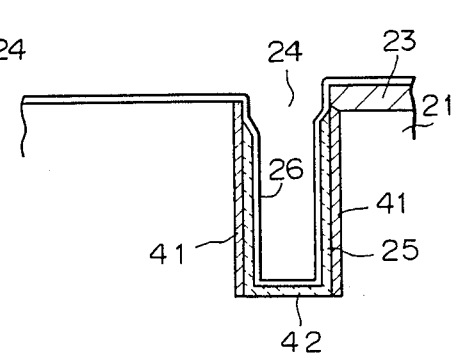

As shown in FIGS. 6A and 6B, a 1,000 Å thick p+ type poly-Si layer is formed by doping arsenic ions having a high concentration by CVD in the entire surface of the substrate including the inner surface of the trench 24. Isotropic etching (e.g., plasma etching) is performed to leave a p+ type poly-Si layer 25 on only the inner wall surface of the trench 24.

The p+ type poly-Si layer 25 is in contact with the p type Si substrate 21 at the bottom of the trench 24 through the opening 42 of the SiO₂ layer 41.

The p+ type poly-Si layer 25 aims at forming a high-impurity region on the wall surface of the trench 24 such a manner that the high-impurity region has the same potential as that of the substrate 21, thereby using the substrate portion as the cell plate (i.e., the counter electrode). The p+ type poly-Si layer 25 is formed on the SiO₂ insulating layer 41 to define the side wall surface of the trench 24. In the subsequent annealing of the fabrication process, the doped impurity atoms (boron atoms in this case, if an n type substrate is used, the impurity atoms are arsenic or phosphorus atoms) are not diffused and scattered into the substrate 21. The p+ type poly-Si layer, i.e., the cell plate 25, is kept as a high-impurity region. Therefore, a decrease in capacitance caused by formation of a depletion layer can be prevented when the p+ type poly-Si layer is used as a capacitor electrode.

After the antioxide film 22 used in selective oxidation is removed, a 100 Å thick Si₃N₄ layer (or a composite film of the Si₃N₄ and SiO₂ layers) 26 as a dielectric layer is formed by oxidation or growth on the entire surface, including the inner surface of the trench 24, with the p+ type poly-Si layer 25.

It is known that a dielectric withstand voltage of the layer 25 is increased when the layer 25 is annealed in an oxygen atmosphere.

Figure 7A:
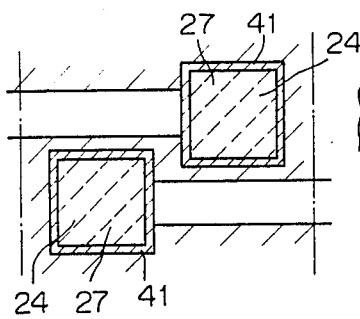
Figure 7B:
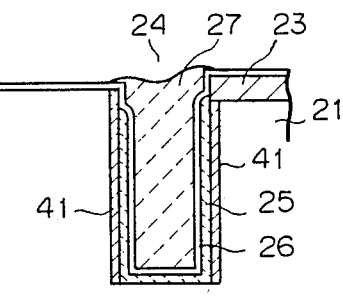

As shown in FIGS. 7A and 7B, an arsenic- or phosphorus-doped n+ type poly-Si layer is grown on the substrate 21 including the trench 24 to sufficiently fill the trench. The poly-Si layer on the substrate is selectively removed by an isotropic etching means, thereby forming an n+ type poly-Si layer 27 which is completely layer 26. The n+ type poly-Si layer 27, i.e., the second conductive layer, serves as a charge storage electrode.

As shown in FIGS. 8A and 8B, the dielectric layer 26 outside the trench 24 is removed to expose the surface of the Si substrate 21. The surface of the substrate 21 is oxidized according to the conventional method of forming a MOS transistor. The MOS transistor of each cell is formed, and a 280 Å thick SiO$_2$ layer 28 is formed as a gate insulating layer for peripheral circuit MOS transistors. In this case, when oxidation is performed at a low temperature of 900° C., the thickness of the SiO$_2$ layer 28 on the surface of the p+ type poly-Si layer (the charge storage electrode) 27 becomes about 6000 Å.

A material serving as a gate material, such as titanium silicide (TiSi$_2$), having a thickness of about 2,000 Å is deposited on the major surface, i.e., the surface having the elements. A 1,000 Å thick SiO$_2$ layer 31A is formed on the gate electrode and is patterned to form a TiSi$_2$ word line pattern having the SiO$_2$ layer 31 thereon. An SiO$_2$ layer 31B having a thickness of about 1,500 Å is formed on the major surface. The SiO$_2$ layer 31A or 31B is left on the upper and side surfaces of the word line pattern by the anisotropic etching means (the conventional technique), thereby forming TiSi$_2$ word lines 30A and 30B covered with the SiO$_2$ layer 31 (31A and 31B) serving as the insulating layer. In this case, the surface of the poly-Si layer 27 on the Si substrate 21 not covered with the word line and the surface of the poly-Si layer 27 surrounded by the trench are exposed.

Using the word line (the gate electrode) 30A as a mask, arsenic ions are implanted according to a conventional method to form n+ type source or drain regions 29A and 29B. An n+ type impurity region 29C is formed in the n+ type poly-Si layer 27 filled in the trench 24.

As shown in FIGS. 9A and 9B, a 4,000 Å thick arsenic- or phosphorus-doped n+ type poly-Si layer is formed on the substrate by a selective deposition method.

In this case, the poly-Si layer is not grown on the SiO$_2$ layers 31 and 23. Third conductive layers 32A and 32B of n+ type poly-Si are formed on the Si surface portion at the source or drain region 29A and 29B and the n+ type poly-Si layer 27, i.e., the charge storage electrode. The n+ type poly-Si layer is not grown on the exposed dielectric layer 26 and the ends of the capacitor defining SiO$_2$ layer 41. However, the thickness of the n+ type poly-Si layer is less than 200 Å, so that the poly-Si layer on the source/drain region 29B is continuous with the poly-Si layer on the charge storage electrode 27 to constitute the third conductive layer 32B. Therefore, the source/drain region 29B is electrically connected to the charge storage electrode 27.

As shown in FIGS. 2 and 3, an insulating interlayer 33 is formed on the entire surface of the substrate according to the conventional method, and a contact hole 34 is formed on the source or drain region 29A at a position where th bit line is in contact with the cell. A bit line 35 made of aluminum or the like is formed on the source or drain region 29 through the contact hole 34.

The memory cell of this embodiment has the following advantages.

The counter electrode, i.e., the cell plate of the charge storage capacitor is formed in the substrate itself, and more specifically, on the insulating layer formed on the side wall surface of the trench. The counter electrode is in contact with the substrate in the bottom of the trench and is defined as a conductive layer having the same potential as that of the substrate through the contact portion. Accordingly, when the substrate is grounded, the counter electrode potenial is very stable. In other words, a decrease in operating margin caused by a so-called voltage bump as well as operation errors do not occur.

The substrate serves as a large electrode plate having a uniform potential distribution. Even if adjacent capacitors are close together, the substrate does not cause interference between these adjacent capacitors.

The interference is defined by charge leakage caused by a punch-through between cells between the capacitors and by a stored charge change given such that the adjacent capacitors are in contact with each other through a depletion layer and charging or discharging of one capacitor influences the operation of another capacitor by electrostatic coupling The charge storage electrode is surrounded by an insulating layer (the dielectric layer) and the depletion layer does not extend into the substrate. Soft errors thus do not occur.

The charge storage capacitor has a structure of an n+ type poly-Si layer, a dielectric layer, and a p+ type poly-Si layer. An inverting layer is not used, and thus a write voltage loss does not occur.

The capacitor is buried under the source or drain regions of the MIS transistor due to the structural feature of the memory cell. The size of the memory cell can be greatly reduced, to that corresponding to one transistor, compared with the conventional memory cell. At the same time, the cell plate is not formed on the substrate, unlike in the conventional memory cell. Also, alignment margins for the cell plate with the capacitor and the transistor need not be considered, thereby further reducing the size of the memory cell.

The counter electrode of the charge storage capacitor comprises a poly-Si layer having a high impurity concentration and formed on the inner surface of the trench formed in the substrate. The poly-Si layer is in selective contact with the side wall surface of the trench through the thin insulating layer. This poly-Si layer is maintained at the same potential as that of the substrate from the electrical viewpoint. However, the impurity of diffusion from the side wall surface of the trench into the substrate is prevented. Even after annealing is performed, there is very little decrease in the impurity concentration of the poly-Si layer.

In the capacitor consisting of the n+ type semiconductor, the dielectric layer, and the p+ type semiconductor, when a voltage is applied to the storage electrode, a depletion layer is formed in the semiconductor substrate. If the n+ and p+ type ion concentrations are low, the depletion layer overlaps the dielectric layer. The effective charge storage capacitance is undesirably reduced depending on the voltage. However, according to the structure of the present invention, the impurity concentration of the counter electrode is not decreased, and thus a decrease in capacitance by the formation of the depletion layer can be prevented.

The cell plate is formed in the substrate, but not formed on the substrate. The word line running next to the word line of the cell is in contact with the charge storage electrode through a thin oxide film equivalent to the gate oxide film, thereby generating a capacitive coupling. In the DRAM, when a given word line is selected, the next word line is basically clamped to the ground potential. The charge storage capacitance of the cell is slightly increased by the capacitive coupling.

FIGS. 10 and 11 are respectively a plan view and a side sectional view illustrating a trench capacitor cell according to another embodiment of the present invention.

In this structure, a memory cell is formed in an n well on a p substrate.

Referring to FIGS. 10 and 11, reference numeral 36 denotes an n well; 107, a charge storage electrode of p+ type poly-Si serving as a second conductive layer buried in the trench through a dielectric layer; 109A and 109B, p+ type S/D regions, respectively; 109C, a p+ type region formed together with the source or drain region; 112A, a third conductive layer of a p+ type poly-Si layer; and 112B, a p+ type poly-Si layer serving as a third conductive layer which electrically connects the source or drain region, e.g., 109B to the charge storage electrode 107 of the charge storage capacitor.

The above structure can be also applied to a semiconductor substrate having a p type well on an n type substrate. In this case, the conductivity type of the conductive layers and the source or drain region is opposite to that in FIG. 3.

A method of manufacturing the trench capacitor cell according to this embodiment will be described below.

The n well 36 having a depth of about 2 μm is formed in a p type Si substrate 21. Following the same procedures as in FIG. 4, an $Si_3N_4$ layer 22 is formed on an element formation region of the n well 36. Using the $Si_3N_4$ layer 22 as a mask, thermal oxidation is performed to form a 4,000 Å thick field $SiO_2$ layer 23 (FIG. 12).

Following the same procedures as in the previous embodiment using RIE, a trench 24 having a depth of 3 to 4 μm reaching the p type substrate 21 is formed in an antioxide region including part of the field insulating layer 23.

Thermal oxidation is then performed to form a 300 Å thick $SiO_2$ insulating layer 41 on the inner wall surface of the trench 24 to define the capacitor region.

Figure 13A:
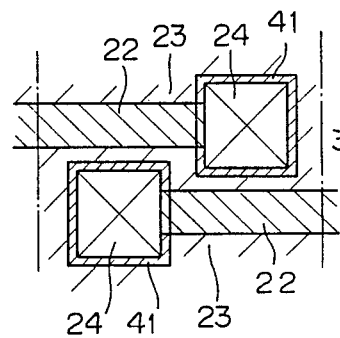
Figure 13B:
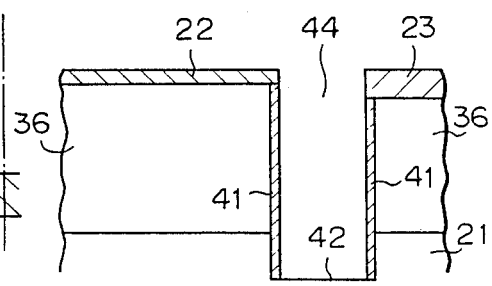

The $SiO_2$ insulating layer 41 at the bottom of the trench 24 is selectively removed by RIE to form an opening 42 so as to expose the surface of the p type Si substrate 21 (FIG. 13).

Subsequently, a 1,000 Å thick boron-doped p+ type poly-Si layer 25 is formed on the inner wall surface of the trench 24. The p+ type poly-Si layer 25 is electrically connected to the p type Si substrate 21 at the bottom of the trench 24 through the opening 42 of the $SiO_2$ layer 41.

Figure 14A:
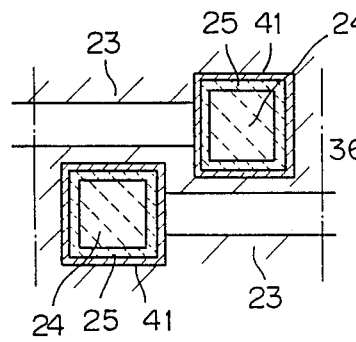
Figure 14B:
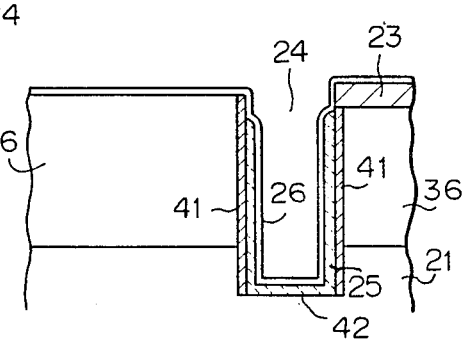

A 100 Å thick $Si_3N_4$ layer (or an $SiO_2$ layer, or a composite film of the $Si_3N_4$ and $SiO_2$ layers) 26 as a dielectric layer is formed by oxidation or growth on the entire surface including the inner wall surface of the trench 24 having the p+ type poly-Si layer 25 (FIG. 14).

Figure 15A:
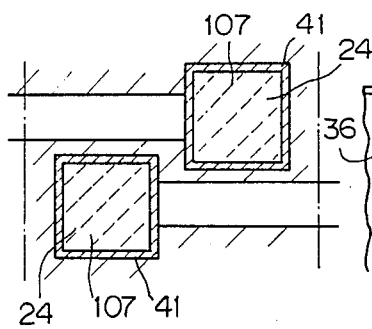
Figure 15B:
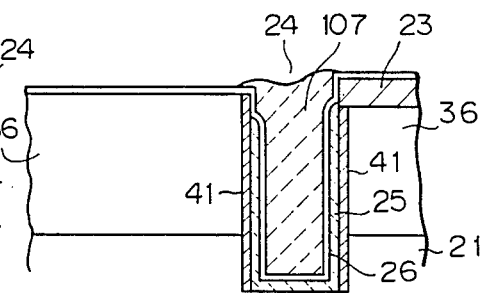

A p+ type poly-Si layer 107 serving as a charge storage electrode is completely filled in the trench 24 through the dielectric layer 26 (FIG. 15).

Figure 16A:
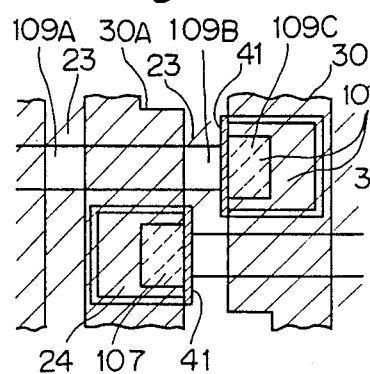
Figure 16B:
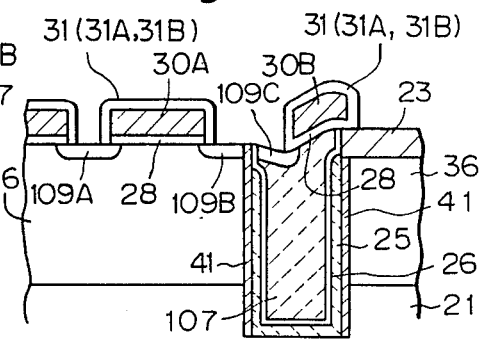
Figure 17A:
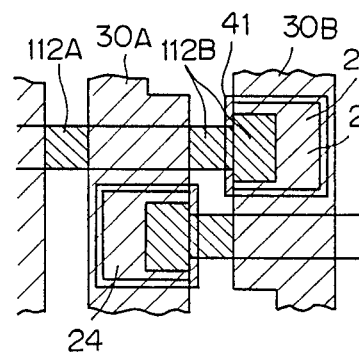
Figure 17B:
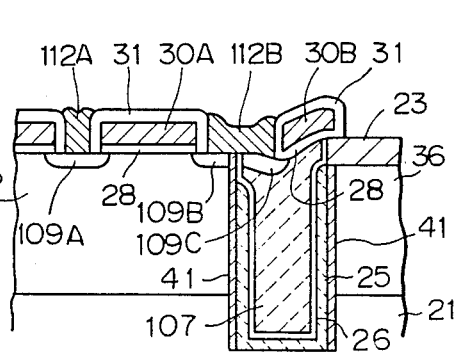

The dielectric layer 26 exposed outside the trench 24 is removed to expose the surface of the n well 36. A gate $SiO_2$ layer 28 is formed on the surface of the n well 36 according to the conventional formation method of MOS transistors For example, $TiSi_2$ word lines 30A and 30B covered with an $SiO_2$ layer 31 (31a and 31b) serving as an insulating layer are formed on the gate $SiO_2$ layer 28. Subsequently, using a word line (a gate electrode) 30A exposed on the n well 36 as a mask, boron ions are implanted to form p+ type source or drain regions 109A and 109B. In this case, a p+ type impurity region 109C is formed in a p+ type poly-Si layer 107 filled in the trench 24 (FIG. 16).

Selective depostion method is performed to form. third conductive layers 112A and 112B of p+ type poly-Si on the exposed Si surface at the source or drain regions 109A and 109B and the p+ type region 109c on the p+ type poly-Si layer 107. The poly-Si layer on the source or drain region 109A is continuous with the poly-Si layer on the charge storage electrode 107. The source or drain region 109 is thus electrically connected to the charge storage electrode 107 (FIG. 17).

According to the conventional method, an insulating interlayer 33 is formed to cover the entire surface of the substrate. A contact hole 34 is formed in the source or drain region 109A at a position where the bit line is in contact with the cell. A bit line 35 made of aluminum or the like is formed.

The resultant memory cell according to this embodiment has the following further advantages.

Since the well receives a voltage by a bias generator or the like, the voltage tends to be unstable. When the counter electrode of the capacitor is in contact with the well, the voltage of the charge storage electrode of the capacitor is changed according to a change in well voltage, thereby reducing the reliability of charge storage information. However, in the structure according to this embodiment, the trench extends through the well and reaches the substrate. Therefore, the counter electrode is electrically connected to the substrate, having a stable potential.

The potential of the charge storage electrode of the capacitor does not vary according to disturbance, and thus the reliability of storage information is improved.

In addition, since the counter electrode and the charge storage electrode have the same conductivity type, a depletion layer is not formed in the counter electrode. As a result, the effective storage capacitance is not decreased.

The present invention can be also applied to a DRAM cell having a conductivity type opposite to that of this embodiment.

Figure 18:
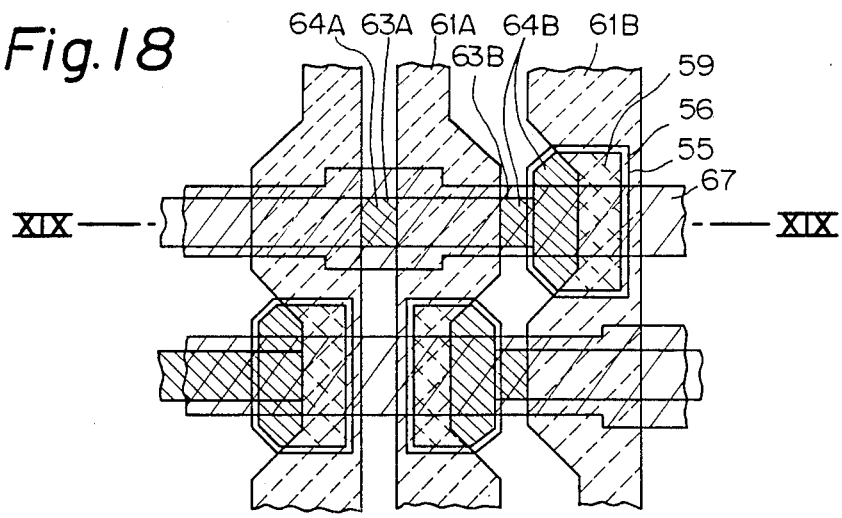
FIG. 18 is a plan view illustrating a trench capacitor cell according to still another embodiment of the present invention.
Figure 19:
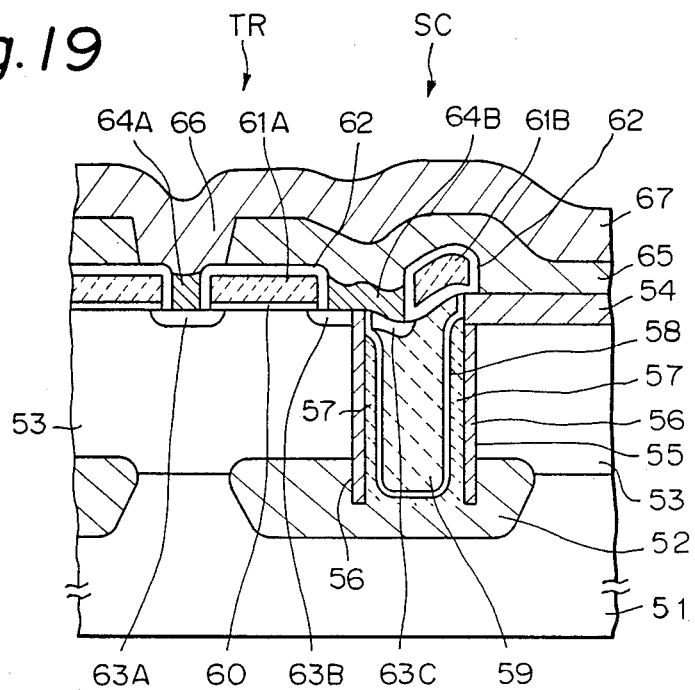
FIG. 19 is a cross-sectional view of the device of FIG. 18 taken along line XIX—XIX.
Figure 20:
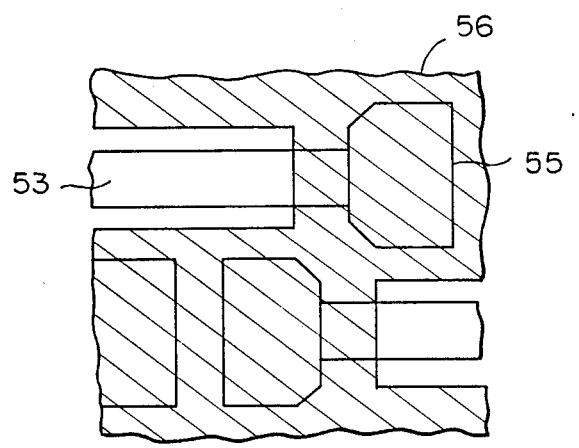
FIG. 20 is a plan view showing a pattern of a buried layer and a trench according to the embodiment shown in FIGS. 18 and 19.

Still another embodiment of the present invention will be described with reference to FIGS. 18 and 19. FIG. 18 is a plan view of this embodiment and FIG. 19 is a side sectional view thereof. FIG. 20 is a plan view showing a buried layer and trench pattern inside the substrate, and FIGS. 21 to 26 are sectional views for explaining the steps in manufacturing this embodiment.

Referring to FIGS. 18 and 19, reference numeral 51 denotes a p type silicon (p type Si) substrate serving as a semiconductor substrate; 52, an n+ type buried layer having an impurity concentration of about $10^{19}$ cm$^{-3}$; 53, a p type epitaxial layer; 54, a field $SiO_2$ layer defining a cell region; 55, a trench formed to include the field region, the bottom of the trench 55 reaching the buried layer 52; 56, an $SiO_2$ insulating layer having a thickness of about 800 to 1,000 Å and formed on the side wall surface of the trench 55; 57, a charge storage capacitor counter electrode on an n+ type poly-Si layer having a thickness of about 1,000 Å and a concentration of about $10^{19}$ cm$^{-3}$; 58, a charge storage capacitor dielectric layer having a thickness of about 150 Å and made of Si or the like; and 59, a charge storage capacitor electrode having an impurity concentration of about $10^{19}$ cm$^{-3}$ and made of an n+ type poly-Si layer.

The charge storage capacitor of the memory cell consists of the counter electrode (the cell plate) 57. H formed on the SiO₂ insulating layer 56 formed on the wall surface of the trench 55 and having a lower portion H ohmically connected to the n+ type buried layer 52 within the trench 55, the dielectric layer 58 formed on the cell plate 57 in the trench 55, and the charge storage electrode 59 of the n+ type poly-Si layer.

Reference numeral 60 denotes an SiO₂ layer serving as a gate dielectric layer; 61A, a word line (a gate electrode) of a self cell, made of a titanium silicide (TiSi₂) layer or the like; 61B, a word line of an adjacent cell; 62, an SiO₂ insulating layer having a thickness of about 1,000 Å; 63A and 63B, n+ type source or drain (S/D) regions each having an impurity concentration of about $10^{19}$ cm$^{-3}$; and 63C, an n+ type region simultaneously formed with the S/D regions.

The p type Si substrate 51, the gate SiO₂ layer 60, the word line 61A, and the S/D regions 63A and 63B constitute a transistor (a cell transistor) of the memory cell.

Reference numeral 64A denotes a third conductive layer made of, e.g., titanium silicide; and 64B, a third conductive layer made of titanium silicide and serving to connect the S/D region 59B of the charge storage electrode 57 to the charge storage electrode 57 of the charge storage capacitor. Therefore, the charge storage capacitor is electrically connected to the cell transistor by the third conductive layer 64B to constitute a DRAM cell Reference numeral 65 denotes an SiO₂ insulating interlayer having a thickness of about 8,000 Å; 66, a wiring contact hole; and 67, a bit line made of aluminum (Al) which is in contact with the S/D region 64B through the n+ type poly-Si layer 66 and the third conductive layer 64B and which extends in a direction perpendicular to the word line 62 (A and B) on the insulating interlayer 65.

FIG. 18 is a plan view illustrating the pattern of the trench capacitor cell according to this embodiment. FIG. 20 is a plan view illustrating the buried layer and trench pattern which corresponds to the pattern of FIG. 18.

As shown in FIGS. 18, 19, and 20, in the trench capacitor cell according to the present invention, the S/D region 63B of the transistor is electrically connected to the second poly-Si layer 59 of the charge storage capacitor through the third conductive layer 64B. Therefore, the second poly-Si layer 59 filled in the trench serves as a charge storage electrode for storing an information charge. The first poly-Si layer 57 surrounding the second poly-Si layer 59 serves as the counter electrode. The arrangement of these capacitor electrodes is reverse to that of the conventional memory cell.

The n+ type buried layer 52 is selectively formed on the p type Si substrate 51 as a semiconductor substrate subjected to the formation of memory cells. The p type Si epitaxial layer 53 is formed on the p type Si substrate 51, and the resultant substrate is used as a bulk substrate.

The charge storage capacitor extends through the p type Si epitaxial layer 53 and reaches the n+ type buried layer 52. The capacitor consists of the counter electrode 57 of the n+ type poly-Si layer formed on the SiO₂ insulating layer 56 on the side wall surface of the trench 55, the dielectric layer 58 formed on the entire surface on the counter electrode 57 in the trench, and the charge storage electrode 59 of n+ type poly-Si filled in the trench 55 through the dielectric layer 58.

The trench capacitor is surrounded by the capsule-like SiO₂ insulating layer 56 formed on the side wall surface of the trench 55 and is insulated from the p type Si epitaxial layer 53 through the SiO₂ insulating layer 56.

The n+ type buried layer 52 selectively formed on the p type Si substrate 51 and the p type Si epitaxial layer 53 serves as the conventional cell plate, i.e., the conventional wiring layer for supplying a voltage to the counter electrode 57.

A method of manufacturing the trench capacitor cell according to this embodiment will be described with reference to the sectional views of FIGS. 21 to 26 and FIG. 19.

Figure 21:
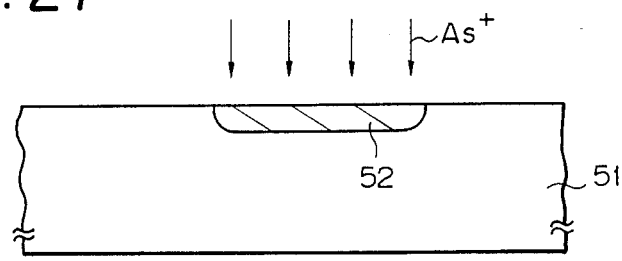
FIGS. 21 to 26 are sectional views showing the steps in manufacturing the embodiment shown in FIGS. 18 and 19.

Arsenic ions (As) are implanted at a high dose of about $10^{16}$ cm$^{-2}$ into the p type Si substrate 51 having a resistivity of about 1 Ωcm by using a mask pattern (not shown). The implanted ions are activated to form the n+ type buried layer 52 (FIG. 21).

Figure 22:
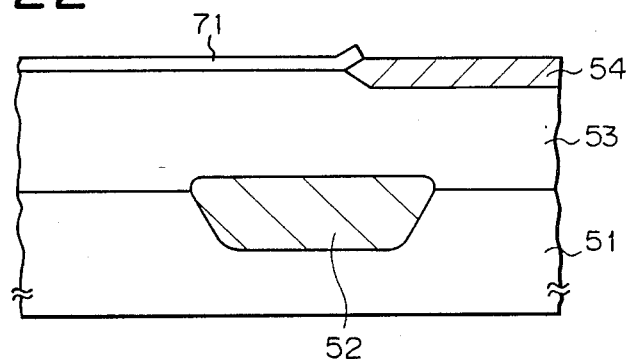

The p type Si epitaxial layer 53 having a thickness of about 2 to 3 μm and a resistivity of about 10 Ωcm is formed on the substrate. For example, an Si₃N₄ layer (or a composite film of the Si₃N₄ and SiO₂ layers) 71 as an antioxide film for selective oxidation is formed on an element formation region. Using the layer 71 as a mask, the surface of the p type Si epitaxial layer 53 is oxidized for form a 4,000 Å thick field SiO₂ layer 54 (FIG. 22).

Using the conventional photolithographic techniques and reactive ion etching (RIE), a trench 55 is formed in the antioxide region including part of the field insulating layer 54 in such a manner that the bottom thereof reaches the buried layer 52.

Subsequently, a capacitor region defining SiO₂ insulating layer 56 having a thickness of about 800 Å is formed on the inner wall surface of the trench 55 by thermal oxidation. The thickness of the insulating layer 56 is not specified. However, if the thickness is excessive, the effective size of the trench is reduced. Therefore, the thickness is preferably less than 1,000 Å.

Figure 23:
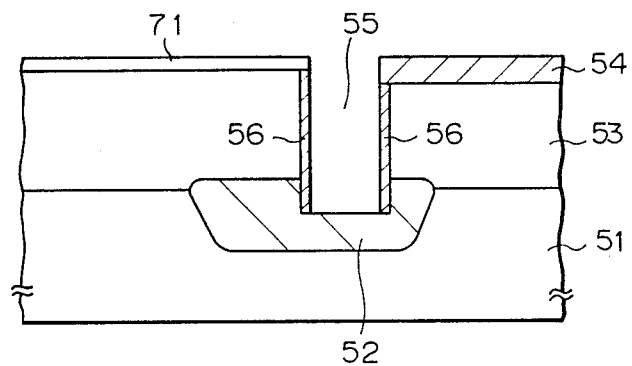

The SiO₂ insulating layer 56 at the bottom of the trench 55 is selectively removed by RIE to expose the n+ type buried layer 52 (FIG. 23).

Figure 24:
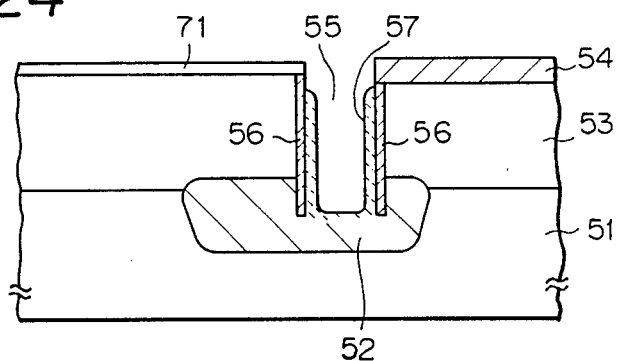

A 1,000 Å thick n+ type poly-Si layer is formed by CVD to cover the entire surface including the wall surface of the trench 55. Anisotropic etching (RIE) is performed to remove the n+ type poly-Si layer on the surface of the substrate. In this case, the counter electrode 57 comprising the first n+ type poly-Si layer is left on the side wall surface of the trench 55. Thereafter, slight wet or plasma etching is performed to remove the poly-Si layer near the opening of the trench 55. Upon etching, the upper end of the counter electrode 57 is removed by 0.5 μm from the opening of the trench 55. This is to increase the dielectric breakdown strength of the capacitor (FIG. 24).

When the above etching is completed, the first n+ type poly-Si layer may be left on the exposed surface of the buried layer 52 at the bottom of the trench 55.

The lower portion of the n+ type Si counter electrode 57 is electrically connected to the n+ type buried layer 52.

The surface of the counter electrode 57 is oxidized (not shown) by a thickness of 50 Å, and a 100 Å thick dielectric layer 58 of an Si₃N₄ layer is formed on the substrate surface including the inner surface of the trench 55.

It is known that the dielectric breakdown strength of the dielectric layer is improved by annealing in an oxygen atmosphere.

An arsenic- or phosphorus-doped second n+ type poly-Si layer is grown on the substrate including the wall surface of the trench 55 having the dielectric layer 58 and is etched by an anisotropic etching means, thereby forming the charge storage electrode 59 of the second n+ type poly-Si layer completely fitted in the trench 55 through the dielectric layer 58.

In this case, the charge storage electrode can be formed in only the trench 55 in a self-aligned manner without using masking. Therefore, the occupying area of the trench capacitor can be reduced.

Figure 25:
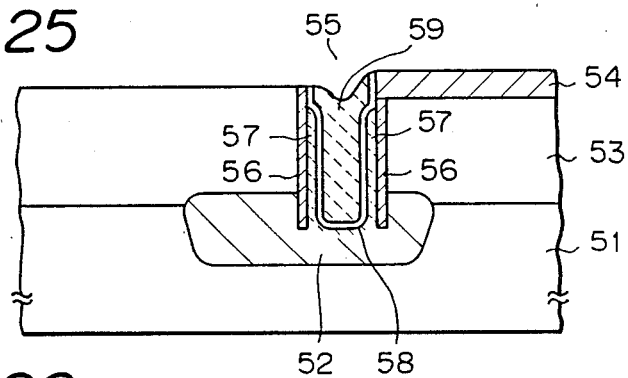

Subsequently, the dielectric layer 58 exposed on the substrate is removed, and the $Si_3N_4$ layer 71 formed for selective oxidation is removed. The active region constituting the transistor and the upper surface of the charge storage electrode 59 filled in the trench 55 are exposed. As described above, the upper end portion of the counter electrode 57 is removed from the opening of the trench 55. Even if the charge storage electrode 59 is slightly overetched, the upper end of the counter electrode 57 does not appear on the surface, and as a result a decrease in capacitor dielectric breakdown strength does not occur, and a short circuit of the capacitor is not formed (FIG. 25).

The surface of the p type Si epitaxial layer is oxidized by the conventional formation method of MOS transistors. A 220 Å thick $SiO_2$ layer 60 is formed as a gate dielectric layer for the MOS transistor of the memory cell and MOS transistors of the peripheral circuits. In this case, when oxidation is performed at a low temperature of about 900° C., the $SiO_2$ layer 60 on the surface of the p+ type poly-Si charge storage electrode 59 has a thickness of about 600 Å.

A gate material such as a titanium silicide ($TiSi_2$) layer having a thickness of about 2,000 Å is formed on the major surface and is patterned to form $TiSi_2$ word lines 61A and 61B. A 1,000 Å thick $SiO_2$ insulating layer 62 is formed on the surface of the word lines 61A and 61B according to a known technique.

Arsenic ions are selectively implanted into the surface of the p type Si epitaxial layer 53 and the charge storage electrode 59 by using the word line (the gate electrode) 61A as a mask, thereby forming n+ type S/D regions 63A and 63B. At the same time, an n+ type impurity region 63C filled in the trench 55 is formed.

Figure 26:
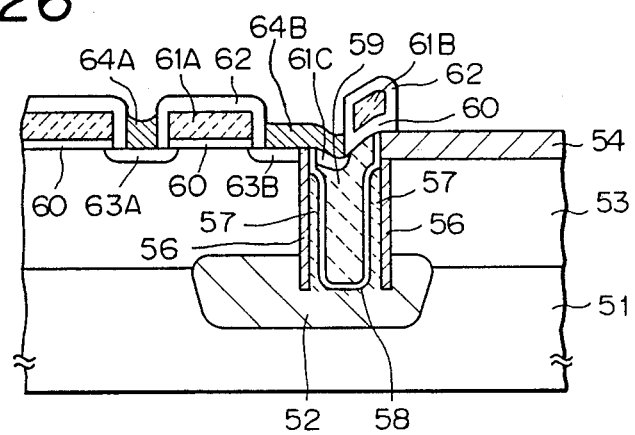

The surfaces of the S/D regions 63A and 63B and the n+ type (impurity-doped) region 63C of the charge storage electrode 59 are exposed by a means such as wet etching. A 1,000 Å thick titanium (Ti) layer is formed on the substrate by sputtering. The titanium layer is annealed and selectively converted into a silicide layer. The remaining Ti layer is selectively etched to obtain titanium silicide ($TiSi_2$) third conductive layers 64A and 64B. In this case, the S/D region 63B is closed to the n+ type (impurity-doped) region 63C, and the integral third conductive layer 64B is formed thereon. As a result, the n+ type S/D region 63B is electrically connected to the n+ type charge storage electrode 59 (FIG. 26).

The third conductive layer may be formed by selectively growing poly-Si on the surface of the silicon substrate.

According to the conventional methods, an insulating interlayer 65 is formed to cover the entire surface of the substrate. A wiring contact hole 66 is formed in the source or drain region 63A at a position where the bit line is in contact with the cell. A bit line 67 made of aluminum or the like is formed.

The resultant trench capacitor cell shown in FIGS. 18 and 19 has the following advantages.

Since the n+ type buried layer 52 serves as the power supply line (the cell plate) for the counter electrode 57 of the capacitor, the cell plate need not be formed on the surface of the substrate. The alignment margin for the transistor and the cell plate need not be considered, and the size of the memory cell can be greatly reduced.

Since the buried layer 52 is formed deep in the substrate, the relative positional relationship between the buried layer 52 and the gate of the transistor need not be considered. A wide buried layer can be formed, and only rough alignment is required to bring the capacitor region into contact with the buried layer 52. Therefore, use of the buried layer 52 does not interfere with the micropatterning of the memory cell.

Since the charge surrounded by the counter electrode 59 of the capacitor is surrounded by the counter electrode 57, an electric field generated by the charge storage electrode 59 is shielded and does not leak outside the cell. Even if the adjacent memory cells are close to each other, an intercell interference such as a punch-through between cells does not essentially occur. The depletion layer does not extend in the substrate, i.e., the p type Si epitaxial layer. Therefore soft errors caused by α-rays can be greatly reduced.

The high-impurity counter electrode 57 is surrounded by the insulating layer 56 and is in contact with the bulk substrate, i.e., the p type Si epitaxial layer 53 through the insulating layer 56. The impurity ions within the counter electrode are not diffused or scattered in the substrate. Even if annealing is performed, the impurity concentration of the counter electrode 57 is not degraded. The decrease in capacitance caused by the formation of the depletion layer within the counter electrode 57 can be prevented.

The counter electrode 57 of the capacitor is electrically insulated from the substrate, i.e., the p type Si epitaxial layer 53 through the capsule-like insulating layer 56. The counter electrode 57 is powered by the buried layer 52 electrically insulated from the substrate through a junction. Therefore, a voltage can be independently applied to the counter electrode. For example, a voltage of ½ the cell transistor logical amplitude voltage applied to the charge storage electrode 59 of the capacitor can be applied to the counter electrode 57 through the buried layer 52. The voltage applied to the dielectric layer 52 is substantially ½ the logical amplitude voltage. The margin of the dielectric breakdown strength of the dielectric layer is increased. Therefore, reliability of the capacitor can be improved, and hence the service lift thereof can be prolonged.

When a structure is taken into consideration wherein the counter electrode is not electrically insulated from the substrate and the substrate itself serves as the counter electrode (i.e., the cell plate). This structure has a disadvantage in that the potential of the counter electrode is a reverse-biased substrate potential $V_{BB}$ (e.g., −3V) so that a large voltage obtained by adding the logical amplitude voltage of about 5V to the reverse-biased component is applied to the dielectric layer of the capacitor, thereby greatly shortening the service lift of the capacitor. In the memory cell shown in FIGS. 18 and 19, the capacitor consists of an n+ type poly-Si layer, a dielectric layer, and another n+ type poly-Si layer. In this manner, since an inverting layer is not used, a write voltage loss does not occur.

Since the capacitor is formed under the source or drain regions of the MIS transistor, the size of the memory cell substantially corresponds to one transistor, thus greatly reducing the cell area as compared with the conventional cell.

The present invention can be also applied to an DRAM having a conductivity type opposite to that of the embodiment.

In the memory cell of FIGS. 18 and 19, there is provided a DRM cell having a trench capacitor structure which allows micropatterning and a high packing density. At the same time, the impurity concentration of the counter electrode of the capacitor is not decreased during annealing, thus preventing a decrease in charge storage capacitance. In addition, the amplitude of the voltage applied across the charge storage electrode and the counter electrode of the capacitor can be reduced to prolong the service lift of the capacitor and improve the reliability thereof.

Still another embodiment of the present invention will be described with reference to FIGS. 27 and 28. FIG. 28 is a sectional view of this embodiment, FIGS. 29A to 34A are plan views for explaining the steps in manufacturing the trench capacitor cell, and FIGS. 29B to 34B are sectional views thereof.

Figure 27:
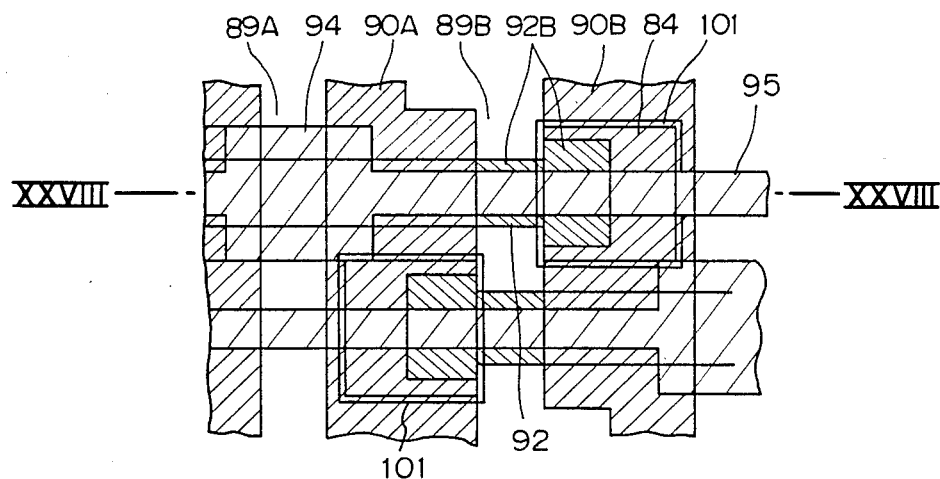
FIG. 27 is a plan view illustrating a trench capacitor cell according to still another embodiment of the present invention.
Figure 28:
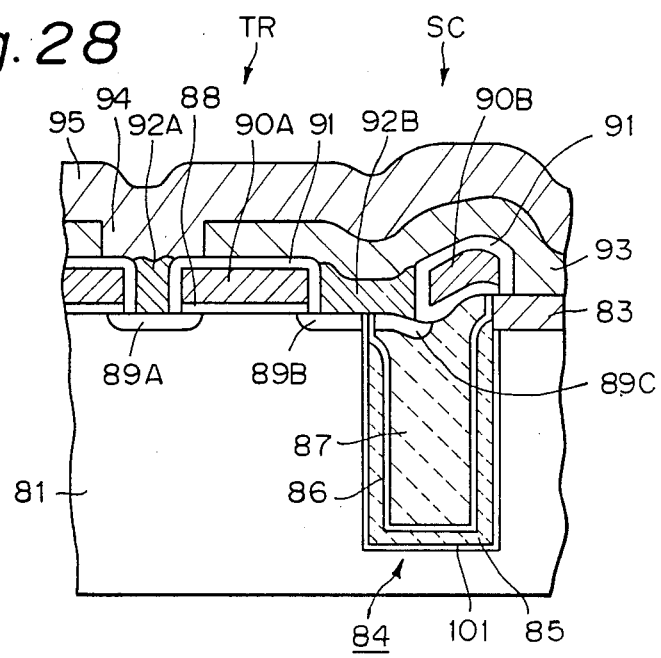
FIG. 28 is a cross-sectional view of the device of FIG. 27 taken along the line XXVIII—XXVIII.

Referring to FIGS. 27 and 28, reference numeral 81 denotes an n type Si substrate serving as a semiconductor substrate; 83, an SiO$_2$ layer serving as a field insulating layer defining the cell area; 84, a trench formed including the field region; 85, a first conductive layer which is formed on the entire area excluding a region near the opening of the trench and which serves as a cell plate (a counter electrode) made of n+ type poly-Si; 86, a dielectric layer made of silicon nitride (Si$_3$N$_4$); 87, a second conductive layer which is filled in the trench through the dielectric layer and H which serves as a charge storage electrode made of p+ type poly-Si; and 101, an SiO$_2$ layer of a thin tunnel insulating layer which has a thickness of about 20 to 60 Å and which allows transmission of the carriers but not impurity atoms. The cell plate 85, the dielectric layer 86, and the charge storage electrode 87 constitute the charge storage capacitor.

Reference numeral 88 denotes an SiO$_2$ layer serving as a gate dielectric layer; 89A and 89B, p+ type source or drain (S/D) regions, respectively; 89C, a p+ type region simultaneously formed with the source or drain regions; 90A, a word line (a gate electrode) of a self cell, which is made of a titanium silicide (TiSi$_2$) layer; and 90B, a word line of an adjacent memory cell. The n type Si substrate 81, the gate dielectric layer 88, the p+ type S/D regions 89A and 89B, and the word line 90A constitute a transistor (i.e., a cell transistor) of the memory cell.

Reference numeral 91 denotes an SiO$_2$ insulating layer; 92A, a third conductive layer made of a p+ type poly-Si layer; 92B, a third conductive layer of a p+ type poly-Si layer for electrically connecting the S/D region, e.g., 89B of the transistor to the charge storage electrode 87 of the capacitor, thereby connecting the charge storage capacitor to the cell transistor to constitute a DRAM cell; 93, an insulating interlayer; 94, a wiring contact hole; and 95, a bit line of aluminum (Al) which is in contact with the S/D region 89A through the third conductive layer 89A and which extends on the insulating interlayer in a direction perpendicular to the word line.

In the trench capacitor cell of FIGS. 27 and 28, the S/D region 89B of the transistor is electrically connected to the charge storage electrode 87 of the charge storage capacitor through the third conductive layer 92 (92B).

The second conductive layer 87 in the trench 84 serves as a charge storage electrode for storing an information charge, and the first conductive layer 85 on the substrate side serves as a cell plate (i.e., a counter electrode). This configuration is reversed to that of the conventional memory cell The p+ type poly-Si layer 92 (92B), i.e., the third conductive layer for connecting the S/D region 89B of the transistor to the charge storage electrode 87 of the capacitor is selectively deposited on the exposed Si surface between the word lines 90A and 90B. The layer 92 can be self-aligned without using a mask process.

Micropatterning and a high packing density of the cell can be achieved.

In the memory cell shown in FIGS. 27 and 28, the very thin tunnel SiO$_2$ layer 101 is formed on the entire wall surface of the trench and has a thickness of, for example, about 20 Å. The layer 101 allows transmission of carriers therethrough but controls diffusion of the impurity atoms into the substrate. The first conductive layer, i.e., an n+ type poly-Si layer as the cell plate (the counter electrode) having the same conductivity as that of the substrate 81 and a high impurity concentration of about $10^{19}$ cm$^{-3}$ is formed on the entire wall surface of the trench through the tunnel SiO$_2$ layer 101.

In the memory cell shown in FIGS. 27 and 28, even if annealing is performed as a subsequent process for forming the S/D regions 89A and 89B, diffusion of the impurity atoms from the cell plate 85 to the substrate 81 is prevented by the tunnel SiO$_2$ layer 101, thereby preventing a decrease in impurity concentration of the cell plate 85. The decrease in capacitor capacitance caused by the formation of a depletion layer at the interface between the dielectric layer 86 and the tunnel SiO$_2$ layer 101 can be thus prevented.

As described above, since the carriers can pass through the tunnel SiO$_2$ layer 101, the potential of the cell plate 85 is the same as that of the substrate 81.

A method of manufacturing the memory cell in FIGS. 27 and 28 will be described with reference to the plan views of FIGS. 29A to 34A and the sectional views of FIGS. 29B to 34B as well as FIGS. 27 and 28.

Figure 29A:
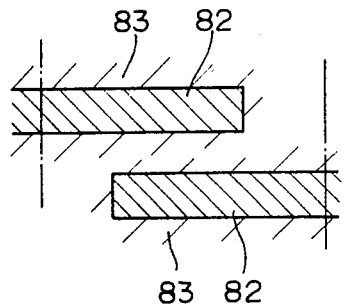
Figure 29B:
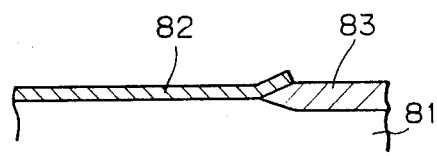

For example, an Si$_3$N$_4$ layer (or a composite film of Si$_3$N$_4$ and SiO$_2$ layers) 82 as an antioxide film for selective oxidation is formed on an element formation area on the surface of the n-Si substrate 81. The Si substrate 81 is oxidized using the Si$_3$N$_4$ film as a mask to form a 4,000 Å thick SiO$_2$ layer 83 serving as a field insulating layer (FIGS. 29A and 29B).

Using photolithographic techniques and reactive ion etching (RIE), a trench 84 having a depth of 3 to 4 μm is formed in an antioxide region including part of the field insulating layer 83.

Figure 30A:
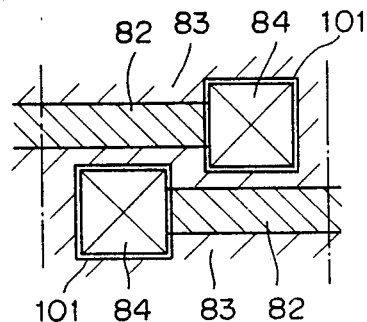
Figure 30B:
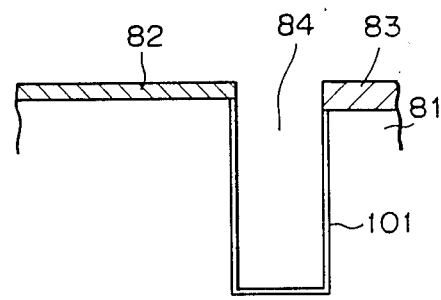

Thermal oxidation is then performed to form a 20 Å thick tunnel SiO$_2$ layer 101 on the inner wall surface of the trench 84. The tunnel SiO$_2$ layer 101 serves as an insulating layer having a thickness that will allow majority carriers (electrons) to flow as a tunnel current through the semiconductor (Si) substrate 81 (FIGS. 30A and 30B).

The tunnel insulating layer may be made of another material such as Si$_3$N$_4$ if it allows tunneling of the carriers therethrough. The tunnel layer has a maximum thickness of about 60 Å if an SiO$_2$ layer is used as the tunnel layer.

Figure 31A:
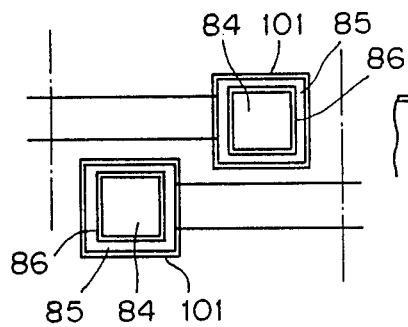
Figure 31B:
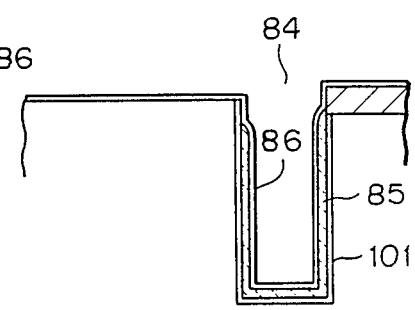

A 1,000 Å thick phosphorus-doped n+ type poly-Si layer is formed by CVD on the entire substrate surface including the inner wall surface of the trench 84. Isotropic etching (plasma etching) is performed to leave the n+ type poly-Si layer 85 in only the trench 84 (FIG. 31).

In this case, the poly-Si layer 85 at the opening of the trench is slightly etched. This slight etching is preferable to improve dielectric breakdown strength between the poly-Si layer 85 and the source or drain regions to be formed to constitute junctions therewith.

The formation of the n+ type poly-Si layer 85 within the trench aims at formation of a high-impurity region within the trench so as to provide the same conductivity type as that of the substrate thereto. The n+ type poly-Si layer 85 allows a substrate portion to serve as the cell plate (the counter electrode).

Since only the very thin insulating layer which allows passage of the carriers therethrough is formed between the n+ type poly-Si layer 85 and the n type Si substrate 81, the layer 85 is electrically connected to the substrate 81. As a result, the n+ type poly-Si layer 85 has the same potential as that of the substrate 81.

A defect may be caused by an accidental pinhole in the very thin insulating layer. However, the n+ type poly-Si layer (the cell plate) 85 can be electrically connected to the substrate 81 even through such a defect.

The formation of the very thin tunnel layer aims at preventing diffusion of the impurity ions from the cell plate 85 into the substrate, and hence preventing a decrease of the impurity concentration of the cell plate in the subsequent heat cycles such as the formation of the source or drain regions and the reflow of the insulating interlayer. The formation of the very thin tunnel insulating layer is aimed at preventing the following; a decrease in impurity concentration of the cell plate 85, i.e., the n+ type poly-Si layer, that causes the formation of the depletion layer in the surface layer of the poly-Si layer 85, and thereby decreases the capacitance of the capacitor.

The tunnel insulating layer prevents the passage of the impurity atoms therethrough. Even if a pinhole is formed in the tunnel insulating layer, the number of impurity atoms diffused through the pinhole is small, and most of the impurity atoms remain in the poly-Si layer 85.

For this purpose, an Si$_3$N$_4$ layer is suitable for the insulating material, since the Si$_3$N$_4$ layer has a narrower band gap than that of the SiO$_2$ layer and thus the carriers tend to easily pass through the film. At the same time, the Si$_3$N$_4$ film texture is denser than the SiO$_2$ film to provide a better prevention of the transmission of the impurity atoms therethrough.

When a p-type substrate is used, the impurity atoms to be doped in the cell plate are boron ions since they are light in weight. Therefore, the Si$_3$N$_4$ layer which is denser than that of the SiO$_2$ film is suitable for the tunnel insulating layer.

A 100 Å thick Si$_3$N$_4$ layer (or an SiO$_2$ layer, or a composite film of the SiO$_2$ and Si$_3$N$_4$ layers) 86 as a dielectric layer is formed by oxidation or growth to cover the entire surface including the inner wall surface of the trench 84 having the n+ type poly-Si layer 85.

It is known that the dielectric breakdown strength of this film can be improved by annealing in an oxygen atmosphere.

Figure 32A:
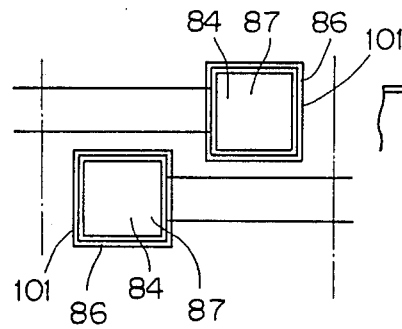
Figure 32B:
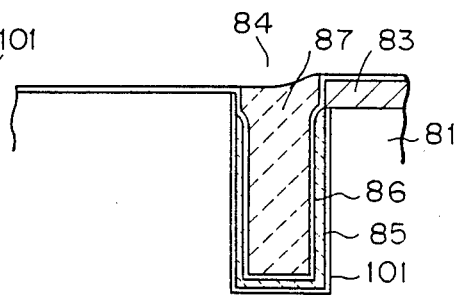

A boron-doped p+ type poly-Si layer having a thickness sufficient to fill the trench is formed on the substrate 81 including the trench 84. Isotropic etching is performed to selectively remove the poly-Si layer from the substrate, thereby forming the p+ type poly-Si layer 87 filled in the trench 84 through the dielectric layer 86. The p+ type poly-Si layer 87, i.e., the second conductive layer serves as the charge storage electrode (FIG. 32).

The dielectric layer 86 exposed outside the trench 84 is removed to expose the surface of the Si substrate 81. The surface of the substrate 81 is oxidized according to the conventional method of forming MOS transistors, thereby forming a 280 Å thick SiO$_2$ layer 88 as the gate dielectric layer. In this case, oxidation is performed at a low temperature of about 900° C., and the thickness of the SiO$_2$ layer 88 on the surface of the p+ type poly-Si layer (the charge storage electrode) 87 is about 600 Å.

A gate material such as titanium silicide (TiSi$_2$) having a thickness of, e.g., about 4,000 Å, is formed on the major surface having elements thereon. An SiO$_2$ layer 91A having a thickness of about 1,500 Å is formed on the titanium silicide film and is patterned to form a TiSi$_2$ word line pattern having the SiO$_2$ layer 91A thereon. Another SiO$_2$ layer 91B having a thickness of about 1,500 Å is formed. The SiO$_2$ layer 91A or 91B is left on the upper and side surfaces of the word line pattern according to the anisotropic etching means (the known techniques), thereby forming the TiSi$_2$ word lines 90A and 90B covered with the SiO$_2$ layer 91 (91A or 91B) serving as the insulating layer. The Si substrate 91 not covered with the word line and the surface of the poly-Si layer 87 filled in the trench 84 are exposed to the outer atmosphere.

Figure 33A:
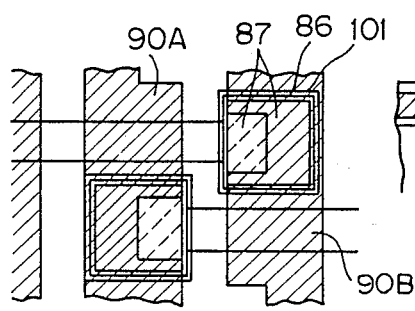
Figure 33B:
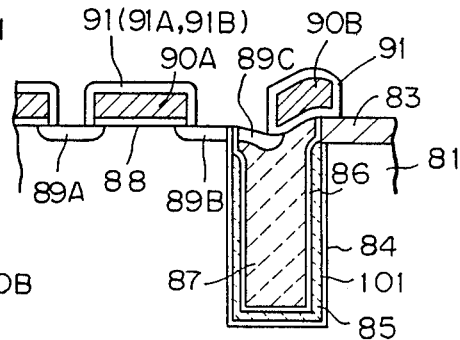
Figure 34A:
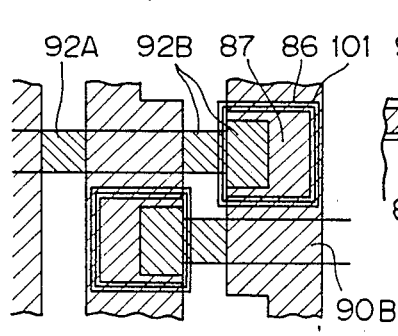
Figure 34B:
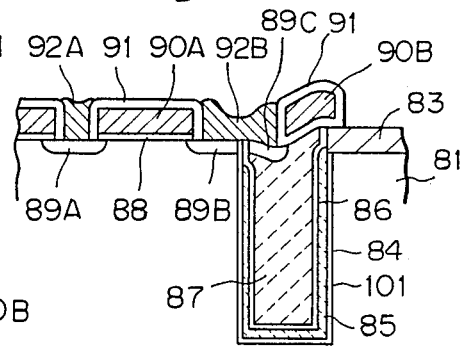

Boron ions are selectively implanted by a conventional method using the word line (the gate electrode) 90A as a mask, and thus the p+ type S/D regions 89A and 89B are formed. At the same time, the p+ type impurity-doped region 89C is formed in the p+ type poly-Si layer 87 filled in the trench (FIGS. 33A and 33B).

A 4,000 Å thick boron-doped p+ type poly-Si layer is selectively grown on the substrate according to the conventional selective deposition means.

The poly-Si layer is not grown on the SiO$_2$ layers 91 and 83. The third conductive layers 92A and 92B are formed on the exposed Si surfaces of the S/D regions 89A and 89B and the p+ type poly-Si layer 87, i.e., the p+ type region 89C, on the upper surface of the charge storage electrode. The p+ type poly-Si layer is not grown on the ends of the dielectric layer 86 and the tunnel SiO$_2$ layer 101. The thickness of the SiO$_2$ layer 101 is 200 Å. The poly-Si layer on the S/D region 89B is continuous with the poly-Si layer on the charge storage electrode 87 to constitute the third conductive layer 92B. Therefore, the S/D region 89B is electrically connected to the charge storage electrode 87.

The insulating interlayer 93 is deposited to cover the entire surface according to the conventional method. A contact hole 94 is formed in the S/D region 89A at a position where the bit line contacts the cell. A bit line 95 made of aluminum is then formed.

The memory cell shown in FIGS. 27 and 28 has the following advantages.

The counter electrde, i.e., the cell plate of the charge storage capacitor is formed on the substrate, more specifically on the substrate through the tunnel insulating layer, to allow easy passage of the carriers according to a tunnel effect. The cell plate has the same potential as that of the substrate through the tunnel insulating layer, and the same conductivity type as that of the substrate. Accordingly, when the substrate is grounded, the counter electrode potential is stabilized, and as a result, a decrease in operating margin caused by a so-called voltage bump as well as operation errors does not occur.

The substrate serves as a large electrode plate having a uniform potential distribution. Even if the capacitors are close together, interference therebetween does not occur.

The interference indicates that charge leakage by a punch-through between cells in the capacitors and an electrical contact between the adjacent capacitors through a depletion layer cause charging or discharging of one capacitor to influence the operation of another capacitor, thereby changing the amount of storage charge.

The charge electrode is surrounded by the insulating layer and the depletion layer does not extend in the substrate. Memory operation errors due to the interference between cells do not occur.

Since the charge storage capacitor has a structure of an n+ type poly-Si layer, a dielectric layer, and a p+ type poly-Si layer, and any inversion layer is not used, write voltage loss does not occur.

Since the capacitor is formed below the S/D regions of the MIS transistors due to the structural convenience of the memory cell, the cell can be greatly reduced to a size corresponding to that of one transistor, as compared with the conventional memory cell. Unlike in the conventional memory cell, the cell plate need not be formed on the substrate, and since alignment margins for the cell plate, the capacitor and the transistor need not be considered, the size of the resultant memory cell can be further reduced.

In the capacitor having the structure of an n+ type semiconductor, a dielectric layer, and a p+ type semiconductor, a depletion layer is formed in the substrate when a voltage is applied to the charge storage electrode.

When the n+ type or p+ type concentration is low, the depletion layer overlaps the dielectric layer. The storage capacitance is undesirably reduced depending on the magnitude of the voltage. In the memorycell of FIGS. 27 and 28, however, the counter electrode serving as the information storage section of the capacitor is the second conductive layer of a high impurity concentration formed on the wall surface of the trench through the tunnel insulating layer. Even if the same voltage applied to the substrate is applied to the second conductive layer through the tunnel insulating layer, the impurity atoms do not substantially pass through the insulating layer. Therefore, in subsequent annealing, the impurity atoms are not diffused into the substrate, and the impurity concentration of the counter electrode is not decreased. A decrease in storage capacitance caused by the formation of the depletion layer on the surface of the counter electrode does not occur. In addition, the storage capacitance does not change depending on the magnitude of the voltage.

The present invention is not limited to the particular embodiments described above, in that the present invention is also applicable to a DRAM cell having a trench capacitor structure formed in an epitaxial layer or a well.

The present invention is also applicable to a DRAM cell having a conductivity type opposite to that of the above embodiments.

I claim:

1. A dynamic random access memory having a trench capacitor, comprising:
   a semiconductor substrate;
   a trench formed in said semiconductor substrate;
   an insulating layer formed on an inner surface of said trench and having an opening at a bottom of said trench;
   a first conductive layer formed at the opening and on said insulating layer, said first conductive layer being ohmically connected to said semiconductor substrate at said opening, an upper end of said first conductive layer being located lower than a top level of said trench for preventing said first conductive layer from being exposed outside said trench;
   a dielectric layer formed on said first conductive layer;
   a second conductive layer formed on said dielectric layer so as to fill said trench,
   a said first conductive layer, said dielectric layer, and said second conductive layer constituting a charge storage capacitor; and
   a MIS transistor formed in said semiconductor substrate,
   wherein said second conductive layer is ohmically connected to a source or drain region of said MIS transistor.

2. A memory according to claim 1, wherein said second conductive layer is ohmically connected to the source or drain region through a third conductive layer.

3. A memory according to claim 1, wherein said semiconductor substrate is a single semiconductor substrate of one conductivity type.

4. A memory according to claim 1, wherein said semiconductor substrate comprises a semiconductor substrate of one conductivity type having a semiconductor layer of the other conductivity type thereon, said trench reaches said semiconductor layer of one conductivity type, and said first conductive layer is ohmically connected to said semiconductor substrate of one conductivty type through said opening.

5. A dynamic random access memory having a trench capacitor, comprising:
   a semiconductor substrate of one conductivity type;
   a buried layer of the other conductiity type formed in said semiconductor substrate;
   a semiconductor layer formed on said semiconductor substrate having said buried layer;
   a trench extending through said semiconductor layer and reaching the buried layer of the other conductivity type;
   an insulating layer formed on an inner side surface of said trench;
   a first conductive layer formed on said insulating layer formed on said trench and having a lower portion ohmically connected to said buried layer, an upper end of said first conductive layer being located lower than a top level of said trench for preventing said first conductive layer from being exposed outside said trench;

a dielectric layer formed on said first conductive layer on the inner surface of said trench;

a second conductive layer filled in said trench and formed on said dielectric layer;

said first conductive layer, said dielectric layer, and said second conductive layer constituting a charge storage capacitor; and a MIS transistor for switching charging or discharging of said charge storage capacitor, wherein said second conductive layer is ohmically connected to one of source and drain regions of said MIS transistor, and said first conductive layer is supplied, through said buried layer of the other conductivity type, with a bias voltage different from that supplied to said semiconductor substrate.

6. A memory according to claim 5, wherein said second conductive layer is ohmically connected to said one of said source and drain regions of said MIS transistor through a third conductive layer.

7. A dynamic random access memory having a trench capacitor, comprising:

a semiconductor substrate of one conductivity type;

a trench formed in said semiconductor substrate;

an insulating layer formed on an entire inner side surface of said trench, said insulating layer having a thickness which allows a passage of carriers therethrough by a tunnel phenomenon;

a first conductive layer formed on said insulating layer and maintained at the same potential as that of said semiconductor substrate through said insulating layer, an upper end of said first conductor layer being located lower than a top level of said trench for preventing said first conductive layer from being exposed outside said trench;

a dielectric layer formed on said first conductive layer;

a second conductive layer of the other conductivity type filled in said trench and formed on said dielectric layer, said first conductive layer, said dielectric layer, and said second conductive layer constituting a charge storage capacitor; and a MIS transistor formed in said semiconductor substrate, wherein said second conductive layer of said charge storage capacity is ohmically connected to a source or drain region of said MIS transistor.

8. A memory according to claim 7, wherein said second conductive layer is ohmically connected to said source or drain region of said MIS transistor through a third conductive layer.

* * * * *

UNITED STATES PATENT AND TRADEMARK OFFICE
CERTIFICATE OF CORRECTION

PATENT NO.   :   4,803,535
DATED        :   February 7, 1989
INVENTOR(S)  :   Masao TAGUCHI It is certified that error appears in the above-identified patent and that said Letters Patent is hereby corrected as shown below:

On the cover page, Item [54], "DYNAMIC RANDOM ACCESS MEMORY TRENCH CAPACITOR" should read --DYNAMIC RANDOM ACCESS MEMORY HAVING TRENCH CAPACITOR--;

Item [73], "Fujitus" should read --Fujitsu--.

Signed and Sealed this

Sixth Day of February, 1990

*Attest:*

JEFFREY M. SAMUELS

*Attesting Officer*       *Acting Commissioner of Patents and Trademarks*